United States Patent [19]

Amelio et al.

[11] Patent Number: 4,639,380

[45] Date of Patent: Jan. 27, 1987

[54] PROCESS FOR PREPARING A SUBSTRATE FOR SUBSEQUENT ELECTROLESS DEPOSITION OF A METAL

[75] Inventors: William J. Amelio; David W. Hume; Donald G. McBride, all of Binghamton; Robert G. Rickert, Endwell, all of N.Y.

[73] Assignee: International Business Machines Corporation, Armonk, N.Y.

[21] Appl. No.: 730,918

[22] Filed: May 6, 1985

[51] Int. Cl.$^4$ .............................. H05K 3/42
[52] U.S. Cl. .......................... 427/97; 134/28; 427/98; 427/304; 427/305; 427/306; 427/444
[58] Field of Search ............ 427/97, 98, 304–306, 427/444; 134/28

[56] References Cited

U.S. PATENT DOCUMENTS

| | | | |
|---|---|---|---|
| 2,938,805 | 5/1960 | Agens | 106/1 |
| 2,996,408 | 3/1958 | Lukes | 117/71 |
| 3,075,855 | 1/1963 | Agens | 117/47 |
| 3,075,856 | 1/1963 | Lukes | 117/47 |
| 3,099,608 | 7/1963 | Radovsky et al. | 204/15 |
| 3,515,649 | 6/1970 | Hepfer | 204/38 |
| 3,563,784 | 2/1971 | Innes et al. | 117/47 |
| 3,632,388 | 1/1972 | Grunwald et al. | 117/47 |
| 3,684,572 | 8/1972 | Taylor | 117/47 |
| 3,844,799 | 10/1974 | Underkofler et al. | 106/1 |
| 3,959,523 | 5/1976 | Grunwald | 427/98 |
| 3,962,497 | 6/1976 | Doty | 134/28 |
| 3,982,045 | 9/1976 | Kukanskis | 427/98 |
| 4,008,343 | 2/1977 | Cohen | 427/98 |
| 4,042,730 | 8/1977 | Cohen | 427/98 |
| 4,066,809 | 1/1978 | Alpaugh et al. | 427/444 |
| 4,152,467 | 5/1979 | Alpaugh et al. | 427/8 |
| 4,227,963 | 10/1980 | Wiggins | 156/668 |
| 4,378,384 | 3/1983 | Murakami | 427/98 |
| 4,537,799 | 8/1985 | Dorey | 427/98 |
| 4,540,464 | 9/1985 | Mueller | 134/28 |

FOREIGN PATENT DOCUMENTS

| | | |
|---|---|---|
| 51-25770 | 3/1976 | Japan ............ 427/97 |
| 51-25771 | 3/1976 | Japan . |

OTHER PUBLICATIONS

G. C. Wilson et al., "Printed Circuits: Plated Through Holes . . . ", Products Finishing, Jan. 1970, pp. 82–87.
Pridans et al., "Method for Through-Hole Plating Void Elimination", IBM Technical Disclosure Bulletin, vol. 21, No. 6, Nov. 1978, p. 2267.
Ciotoli et al., "Pre-Anneal Cleaning Process", IBM Technical Disclosure Bulletin, vol. 21, No. 12, May 1979, p. 4795.

*Primary Examiner*—John D. Smith
*Attorney, Agent, or Firm*—Pollock, Vande Sande & Priddy

[57] ABSTRACT

A substrate is prepared for subsequent electroless deposition of a metal by contacting the substrate with a surfactant and with an organic carboxylic acid, and subsequently contacting the substrate with sulfuric acid.

20 Claims, No Drawings

PROCESS FOR PREPARING A SUBSTRATE FOR SUBSEQUENT ELECTROLESS DEPOSITION OF A METAL

DESCRIPTION

1. Technical Field

The present invention is concerned with conditioning a substrate and is particularly concerned with treating a substrate to prepare it for subsequent electroless deposition of a conductive metal thereon. The conditioning, in accordance with the present invention, is on at least one major surface of the substrate, as well as in holes provided in the substrate. The present invention finds particular applicability for the treatment of substrates to be used in the manufacture of printed circuit cards and printed circuit boards.

2. Background Art

In the manufacture of printed circuit cards printed and circuit boards, a dielectric sheet material is employed as the substrate. A conductive circuit pattern is provided on one or both of the major surfaces of the substrate.

A conductive pattern can be formed on the surface of the substrate using a variety of known techniques. These known techniques include the subtractive technique where a layer of copper is etched to form the desired circuit pattern, the EDB (electroless direct bond) technique, where copper is electrolessly plated directly on the surface of the substrate in the desired pattern, the peel-apart technique where the desired circuit pattern is plated up from a thin layer of peel-apart copper.

In the above techniques, connections between layers are made by means of plated through-holes. In plating such holes, copper must be plated directly on the dielectric substrate (on the walls of the holes). Since the dielectric substrate is non-conductive, in order to plate thereon, the substrate must be seeded or catalyzed prior to the deposition of metal onto the substrate.

Among the more widely employed procedures for catalyzing a substrate is the use of a stannous chloride sensitizing solution and a palladium chloride activator to form a layer of metallic palladium particles.

In addition, in order to provide the desired circuit pattern on the major surfaces of the substrate, a photoresist layer is applied over the thin metal layer already present on the major surfaces of the substrate and is then developed to form either a negative image of the desired circuit pattern, followed by additional metal plating to build up the conductor portions of the circuit to the desired thickness.

After this, the resist is stripped and the printed circuit board is etched to completely strip away the initial thin metal deposit from the non-circuit areas, leaving only the heavier plating, that is, the circuit areas on the board.

However, prior to applying the metal plating and after application of the photoresist, it is necessary to clean the substrate in order to ensure the quality of the metal coating. The precleaning is intended to ensure removal of oxides and to remove contaminants which may have formed in the holes or on the circuit pattern or substrate due to the processing of the photoresist and/or due to punching or drilling operation necessary to provide the holes. For instance, loose particles of the resin of the dielectric substrate, such as the epoxy resin, undeveloped photoresist, and of reinforcing material, such as fiberglass, may be left on the walls of the holes and/or on the circuit pattern or substrate which must be removed.

Various precleaning methods have been suggested. For instance, one such method involves the use of HCl, along with GaFac RE-610 as a wetting agent. However, such procedure, although effective, still has room for improvement in that some plating voids are observed and that the cleaning does not provide a completely activated surface. In addition, the use of a specific wetting agent solution is disclosed by Pridans, et al., "Method for Through-Hole Plating Void Elimination", IBM Technical Disclosure Bulletin, Vol. 21, No. 6, November 1978, p. 2267. The specific wetting agent was a solution of Neutra-Clean No. 7 (a trademark of Shipley Company). This solution is employed at a temperature of about 150° F. Also, Japanese patent application publication No. J-5-1025-77 suggests a preplating treatment for through-holes using sulfuric acid followed by immersion in a dimethylsulfoxide bath. The dimethylsulfoxide bath, however, is necessary in order to solublize any reaction residue which may have occurred between the sulfuric acid and the insulating resin. This evidences a problem that can occur when using an acid wash.

Moreover, a discussion of treating plated through-holes can be found in *Products Finishing*, January 1970, pp. 82-87, "Printed Circuits-Plated Through Holes", Wilson, et al.

Compositions containing sulfuric acid are also suggested for other purposes in treatments of surfaces such as Ciotoli, et al., "Pre-Anneal Cleaning Process", IBM Technical Disclosure Bulletin, Vol. 21, No. 12, May 1979, p. 4795 and U.S. Pat. No. 4,227,963 to Wiggins. For instance, Wiggins reports conditioning a polymer surface for metallizing by treating with an etching solution containing sulfuric acid and a carboxylic acid. The concentration of the sulfuric acid employed is about 97%.

SUMMARY OF THE INVENTION

The present invention is concerned with a process for pretreating substrate to prepare it for subsequent electroless metal deposition and is especially concerned with substrates which contain through-holes. By the method of the present invention, plating voids which are especially a problem in through-holes can be significantly reduced. In addition, in accordance with the present invention, reduced undercutting of the photoresist which is applied has been observed.

In accordance with the present invention, the substrate to be plated is pretreated with a surface active agent and preferably, a cationic surface active agent and with an organic carboxylic acid. Subsequent to the treatment with the surface active agent and with the carboxylic acid, the substrate is treated with an aqueous solution of sulfuric acid. It is necessary, in order to achieve the results obtained by the present invention, that the concentration of the sulfuric acid aqueous solution be about 2% to about 20% by volume of sulfuric acid. Use of concentrations above 20% by volume of the sulfuric acid can result in undesirable etching of the surfaces being treated.

BEST AND VARIOUS MODES FOR CARRYING OUT INVENTION

The process of the present invention is especially effective for treating substrates having metal layers, such as copper, on the major surfaces thereof, being separated by a dielectric material. The dielectric substrate material includes both thermoplastic and thermosetting polymers and preferably, thermosetting polymers. Typical thermosetting polymeric materials include epoxy, phenolic base materials, and polyimides. The dielectric materials may be molded articles of the polymers containing fillers and/or reinforcing agents, such as glass filled epoxy or phenolic base materials. Examples of some phenolic type materials include copolymers of phenol, resorcinol, and cresol. Examples of some suitable thermoplastic polymeric materials include polyolefins, such as polypropylene; polysulfones; polycarbonates; nitrile rubbers; and ABS polymers.

The preferred substrates treated in accordance with the present invention include an epoxy-glass fiber reinforced dielectric substrate.

In the preferred aspects of the present invention, the substrate to be treated has the desired holes drilled or punched therethrough prior to the treatment. The drilling or punching operation results in particles of the dielectric such as the epoxy resin and reinforcing agent or fillers, such as fiberglass, on the walls of the holes.

Also, in accordance with preferred aspects of the present invention, the substrate to be treated is already catalyzed for the subsequent electroless metal deposition, and especially the vias, and may also contain a thin layer of plated metal such as copper on at least one major surface. Such thin layers, when present, are usually about 0.1 to about 0.3 mils thick.

On the other hand, the final plating thickness for printed circuit applications is desirably about 1.5 to about 2.5 mils thick on the major surfaces of the substrate.

The substrate can be catalyzed by, for instance, a two-step activation procedure using stannous chloride in hydrochloric acid, followed by a dip in palladium chloride in hydrochloric acid or by a one-step procedure employing a tin-palladium hydrosol or a triple seeder process. In addition, it may be desirable to subject the catalyzed board to an accelerating solution of, for instance, a dilute solution of suitable acid or alkali.

In the two-step activation procedure, the stannous chloride solution usually contains about 50 to about 100 grams per liter of stannous chloride and about 5% to about 20% by volume of hydrochloric acid; and the palladium chloride solution usually contains about 5 to about 20 grams per liter of palladium chloride and about 5% to about 20% by volume of hydrochloric acid.

A typical triple seeder process includes first contacting the dielectric substrate surfaces and/or the through holes with a stannous chloride sensitizing solution ($SnCl_2$/HCl). Typically, the contacting time is from 4 to 10 minutes with a preferred contact time of 7 minutes. Contacting the dielectric surface with this solution conditions the surfaces including the through holes by depositing thereon a layer of tin ($Sn^{+2}$). The stannous chloride is then rinsed from the substrate and/or through holes with water. A hot water rinse being in a temperature range from 55° C. to about 80° C. is preferred. The hot water removes any excess stannous chloride and also hydrolizes the $SnCl_2$ on the surface to produce gelatinous tin hydrous oxides, which are absorbed on the surface of the board as a stannous complex.

The next seeding step includes contacting the dielectric substrate surfaces and/or the through hole surfaces with a palladium chloride activator in which divalent palladium interacts with the stannous compounds on the board surface to form an adherent layer of metallic palladium particles thereon. This may be accomplished by immersing the dielectric in the palladium activator bath for 2±1 minutes.

This step promotes the adhesion of the final seeding step and increases the concentration of the final catalytic layer which is deposited in the final seeding step.

The third step of the seeding process includes contacting the substrate surface and/or through hole surfaces with a palladium chloride-stannous chloride/hydrochloric acid seeder bath. While a preferred contact time of 5 minutes is desired, it has been found that the actual contact time can vary from 1 to 10 minutes and still provide satisfactory results. This step deposits the final catalytic layer which permits the additive metal such as copper to be plated electrolessly on the surface and in the through holes of the dielectric substrate.

In preparing the solution for the first step of the process, it is found that the combination of stannous chloride having a content of between 53 and 57 grams per liter of $SnCl_2.2H_2O$ with 37% hydrochloric acid at a ratio of 50 milliliters per liter with the pH of the solution adjusted to a range between 0.2 and 0.5 provides a desired preconditioning solution. The $SnCl_2.2H_2O$ is dissolved in the HCl with the resulting mixture being added to a tank of deionized water. It is generally found that the optimum results are obtained when the pH is approximately 0.4 and the solution is maintained at a temperature of 65° F.±10° F.

For the second step of the triple seeder process, the palladium chloride bath is formed by mixing 50 grams of palladium (with a concentration of 0.13 to 0.17 grams per liter) with approximately 3780 milliliters of 37% hydrochloric acid (having a concentration of 10 milliliters per liter). The $PdCl_2$ is dissolved in the hydrochloric acid with the resultant mixture being added to a tank of deionized water. Again, the bath is maintained at a temperature of 65° F.±10° F., the pH is maintained between 0.75 and 1.00, and the copper content of the solution is kept below 50 parts per million.

The final catalytic palladium chloride/stannous chloride/hydrochloric acid seeder bath includes a bath comprising 1.2 to 2.5 grams per liter of $PdCl_2$ with 80 to 150 grams per liter of $SnCl_2.2H_2O$ together with between 280 and 360 milliliters of 37% HCl per liter of solution. This third seeding bath is again maintained at a temperature of 65° F±10° F. The optimum solution of the bath includes about 1.5 grams per liter of $PdCl_2$, 100 grams per liter of $SnCl_2$, and 280 milliliters per liter of 37% hydrochloric acid.

For a further discussion of seeder compositions and processes of applying same, attention is directed to U.S. Pat. Nos. 3,099,608; 3,632,388; and 4,066,809, disclosures of which are incorporated herein by reference.

Although it is preferred that the substrate treated in accordance with the present invention is already catalyzed for the subsequent electroless metal deposition, it is understood that the pretreatment of the present invention can be carried out before the substrate is rendered catalytic for the subsequent electroless metal deposition.

After sensitization and before the pretreatment in accordance with the present invention, the desired circuit pattern is defined by conventional photoresist process. For instance, a negative photoresist material is applied to the substrate and then, by use of a mask, the photoresist is subjected to light of suitable wavelength to cause crosslinking or curing of the photoresist. Then, unexposed photoresist material is removed by treating with chemical, such as methylchloroform in areas where the circuitry is to be plated. Suitable photoresist materials are well-known in the art and need not be discussed herein in any great detail. Many of such are available from du Pont. The areas in which the photoresist is removed are those areas where the circuitry is to be plated.

The process of the present invention includes treating the substrate with a surfactant and an organic carboxylic acid. The substrate can be treated with the surfactant and carboxylic acid separately or together. The surfactant employed should be a cationic surfactant. In the preferred aspects of the present invention, the substrate is treated with the surface-active agent and carboxylic acid at temperatures of about 30° C. to about 60° C. for about 1 second to about 2 minutes and preferably, about 30 to about 90 seconds.

Examples of suitable organic carboxylic acids are formic acid and acetic acid. The preferred acid employed is formic acid.

An example of a suitable cationic surfactant is GaFac RE-610, which is a cationic organic phosphate ester. Discussion of other cationic surfactants can be found in U.S. Pat. Nos. 3,684,572; 3,563,784; and 3,515,649, disclosures of which are incorporated herein by reference.

In the preferred aspects of the present invention the substrate is treated with an aqueous composition which contains both of said acid and cationic surfactant. Generally, such composition contains about 3% to about 20% by weight of said acid and about 20% to about 26% by weight of the cationic surfactant. In many instances it is also preferred to include about 5% to about 15% by weight of $NH_4Cl$ in said compositions. One particular preferred composition is available under the trade designation Enthone 433, available from Enplate, which contains about 20% to about 26% by weight of a cationic surface-active agent, about 3% to about 5% by weight of formic acid, and about 6% to about 7% by weight of $NH_4Cl$.

The ammonium chloride helps to remove photoresist material which may be present.

After treatment with the formic acid and surfactant, the substrate is treated with an aqueous solution of sulfuric acid. It is critical to the process of the present invention that the substrate be treated with the surfactant prior to the treatment with the sulfuric acid in order to facilitate migration of the sulfuric acid into the holes of the substrate. The treatment with the sulfuric acid is normally at temperatures of about 25° C. to about 75° C. for about 1 to about 2 minutes. The aqueous sulfuric acid composition employed contains from about 2% to about 20% by volume concentration of sulfuric acid and preferably, from about 4% to about 10% by volume. Concentrations of sulfuric acid greater than about 20% tend to cause etching of the metal, such as copper, on the surface of the substrate which is undesirable. In addition, such concentrations also tend to etch the polymer, such as the epoxy, of the dielectric substrate.

The substrates to be treated are generally placed in a tank containing the compositions used for the treatment and are agitated in the tank. During treatment, it is usually preferred to bubble an inert gas, such as nitrogen, in order to exclude the presence of oxygen.

After treatment with the sulfuric acid, the substrates treated are then rinsed with deionized water at about room-temperature. In the preferred aspects of the present invention, an inert gas, such as nitrogen, is bubbled through the deionized water in order to exclude the presence of oxygen which tends to form metal oxide on the layer.

Next, the metal, such as nickel or copper, is plated, preferably by electroless plating, onto those preselected areas of the dielectric substrate which do not contain the photoresist material. The metal is coated to the desired thickness of the circuitry. The preferred metals employed are nickel and copper and most preferably, copper. Typical copper electroless plating baths and their method of application are disclosed in U.S. Pat. Nos. 3,844,799 and 4,152,467, disclosures of which are incorporated herein by reference.

The copper electroless plating bath is generally an aqueous plating composition which includes source of cupric ion, a reducing agent, a complexing agent for the cupric ion, and a pH adjustor. The plating baths also preferably include a cyanide ion source and a surface-active agent.

The cupric ion source generally used is a cupric sulfate or a cupric salt of the complexing agent to be employed. When employing cupric sulfate, it is preferred to use amounts from about 3 to about 15 grams/liter. The most common reducing agent employed is formaldehyde which, in the preferred aspects of the present invention, is used in amounts from about 0.7 to about 7 grams/liter and most desirably, from about 0.7 to about 2.2 grams/liter.

Examples of some suitable complexing agents include Rochelle salts, ethylenediaminetetraacetic acid, the sodium (mono-, di-, tri-, and tetra-sodium) salts of ethylenediaminetetra-acetic acid, nitrilo triacetic acid and its alkali salts, gluconic acid, gluconates, triethanolamine, and modified ethylenediamine acetates, such as N-hydroxy-ethylmethylene-diamine triacetate.

In addition, a number of other suitable complexing agents are suggested in U.S. Pat. Nos. 2,996,408; 3,075,856; 3,075,855; and 2,938,805.

The amount of complexing agent is dependent upon the amount of cupric ions present in the solution and is generally from about 20 to about 50 grams/liter or in a 3-4 fold molar excess.

The plating bath can also contain a surfactant which aids in helping to wet the surface to be coated. A satisfactory surfactant is, for instance, an organic phosphate ester, available under the trade designation Gafac RE-610. Generally, the surfactant is present in amounts from about 0.02 to about 0.3 grams/liter. In addition, the pH of the bath is also generally controlled, for instance, by the addition of a basic compound, such as sodium hydroxide or potassium hydroxide in the desired amount to achieve the desired pH. The preferred pH of the electroless plating bath is between 11.6 and 11.8.

In addition, the plating bath also contains a cyanide ion and most preferably, about 10 to about 25 milligrams/liter to provide a cyanide ion concentration in the bath within the range of 0.0002 to 0.0004 molar. Examples of some cyanides are the alkali metal, alkaline earth metal, and ammonium cyanides. The preferred plating baths employed have a specific gravity within the range of 1.060 to 1.080. In addition, the temperature of the bath is preferably maintained between 70° C. and 80° C. For a discussion of the preferred plating temperatures, coupled with the preferred cyanide ion concentrations, see U.S. Pat. No. 3,844,799.

The following non-limiting examples are presented to further illustrate the present invention.

EXAMPLE 1

A copper coated epoxy-fiberglass laminate already catalyzed by the triple seeder procedure described above and having predrilled holes is cleaned by first placing the substrates in a bath containing 23% concentration of Enthone 433 maintained at about 50° C. and treated therein for about 60 seconds. The bath is agitated by bubbling $N_2$ gas through the bath. The substrates are then removed from the Enthone 433 treating solution and placed in a tank containing an aqueous solution of sulfuric acid at 6.5% concentration and at normal room temperature. The bath is continually agitated by bubbling nitrogen gas through the bath. The treatment is for about 60 seconds.

Next, the substrates are rinsed at ambient temperature in deionized water for about 1 minute and bubbled with nitrogen gas. This rinsing step in deionized water is repeated.

The treated laminate is then placed in an electroless copper plating bath as described hereinabove. The plating is continued for several hours to provide copper film having a total thickness of about 1.95 mils. The plated laminate is removed from the bath and tested to determine the necessary force to detach the copper layer which is referred to as "pull-strength". The test involves cutting the coated vias out of the laminate and adhesively mounting them on a rigid surface. The vias are filled with an epoxy and a metal wire is placed in the epoxy and extending from the top of the via. Tension is then applied to the wire and the amount of tension needed to cause the metal copper to delaminate is recorded and converted into pounds per square inch by dividing the force by the cross-section of the via.

The average pull-strength for three samples tested is about 21,217 psi.

COMPARISON EXAMPLE 2

Example 1 is repeated, except that the precleaning process involves pretreatment with an aqueous solution of the 6.5% concentration of sulfuric acid, followed by rinse in ethylenediaminetetraacetic acid at 50° C. in place of the first two steps discussed hereinabove in Example 1. The average pull-strength achieved by this treatment is only 11,376 psi.

COMPARISON EXAMPLE 3

Example 1 is repeated, except that the preclean process sequence includes treatment in the aqueous solution of sulfuric acid (6.5% concentration) and 10% Gafac RE-610 at ambient temperature. The average pull-strength achieved is only 8589 psi.

A comparison of Example 1 to Examples 2 and 3 clearly demonstrates the significant improvement in pull-strength achieved by the sequence of the present invention and illustrates the necessity of treatment with the surface-active agent prior to treatment with the sulfuric acid.

Having thus described our invention, what we claim as new and desire to secure by Letters Patent is:

1. A process for preparing a substrate for the electroless deposition of a metal thereon which comprises contacting the substrate with a surfactant and with an organic carboxylic acid, and then contacting said substrate with an aqueous sulfuric acid solution containing about 2% to about 20% by volume of sulfuric acid.

2. The process of claim 1 wherein said organic carboxylic acid is acetic acid or formic acid.

3. The process of claim 1 wherein said carboxylic acid is formic acid.

4. The process of claim 3 wherein said surfactant is a cationic surfactant.

5. The process of claim 1 wherein said surfactant is a cationic surfactant.

6. The process of claim 1 wherein the concentration of sulfuric acid is about 4% to about 10% by volume.

7. The process of claim 1 wherein the substrate is contacted simultaneously with said surfactant and organic carboxylic acid.

8. The process of claim 1 wherein said substrate is catalyzed for said electroless plating prior to contacting with said surfactant and said acid.

9. The process of claim 1 wherein said contacting with said surface-active agent and said carboxylic acid is at about 30° C. to about 60° C. for a time of about 1 second to about 2 minutes.

10. The process of claim 9 wherein said time is about 30 to about 90 seconds.

11. The process of claim 1 which further includes contacting said substrate with $H_4Cl$.

12. The process of claim 1 wherein the treatment with sulfuric acid is at temperatures of about 25° C. to about 75° C. for about 1 to about 2 minutes.

13. The process of claim 1 wherein said substrate includes a thin layer of metal on at least one major surface thereof prior to contacting with said surfactant and organic carboxylic acid.

14. The process of claim 13 wherein said layer is about 0.1 to about 0.3 mils thick.

15. The process of claim 13 wherein said substrate includes vias and wherein said vias are catalyzed for said electroless plating prior to contacting with said surfactant and said carboxylic acid.

16. The process of claim 15 wherein said layer is about 0.1 to about 0.3 mils thick.

17. The process of claim 15 wherein said organic carboxylic acid is acetic acid or formic acid; said surfactant is a cationic surfactant, the contacting with said surface-active agent and said carboxylic acid is at about 30° C. to about 60° C. for a time of about 1 second to about 2 minutes; and wherein the treatment with sulfuric acid is at temperatures of about 25° C. to about 75° C. for about 1 to about 2 minutes.

18. The process of claim 17 which further includes contacting said substrate with $NH_4Cl$ wherein the concentration of sulfuric acid is about 4% to about 10% by volume and wherein said layer is about 0.1 to about 0.3 mils thick.

19. The process of claim 18 wherein said substrate is epoxy-fiberglass and said layer is copper.

20. The process of claim 1 wherein said substrate includes vias and wherein said vias are catalyzed for said electroless plating prior to contacting with said surfactant and said carboxylic acid.

* * * * *